United States Patent [19]
Dougherty et al.

[11] Patent Number: 5,885,648
[45] Date of Patent: Mar. 23, 1999

[54] PROCESS FOR MAKING STOICHIOMETRIC MIXED METAL OXIDE FILMS

[75] Inventors: Thomas K. Dougherty, Playa Del Rey; O. Glenn Ramer, Los Angeles, both of Calif.

[73] Assignee: Raytheon Company, El Segundo, Calif.

[21] Appl. No.: 863,117

[22] Filed: May 27, 1997

Related U.S. Application Data

[63] Continuation of Ser. No. 635,313, Apr. 19, 1996, abandoned.

[51] Int. Cl.$^6$ ....................................................... B05D 3/02
[52] U.S. Cl. ............................ 427/8; 427/226; 427/126.2; 427/126.3; 427/419.3; 427/419.2; 427/379; 427/380; 427/240
[58] Field of Search ................................ 427/226, 126.2, 427/126.3, 419.3, 419.2, 379, 380, 240

[56] References Cited

U.S. PATENT DOCUMENTS

| | | | |
|---|---|---|---|
| 5,198,269 | 3/1993 | Swartz et al. | 427/226 |
| 5,316,579 | 5/1994 | McMillan et al. | 118/50 |
| 5,406,510 | 4/1995 | Mihara et al. | 364/145 |
| 5,434,102 | 7/1995 | Watanabe et al. | 437/130 |
| 5,439,845 | 8/1995 | Watanabe et al. | 437/130 |

OTHER PUBLICATIONS

C.A–Paz de Araujo et al, "Fatigue–free ferroelectric capacitors with platinum electrodes", *Nature*, vol. 374, pp. 627–629 (Apr. 1995).

J.Y. Mantese et al, "Characterization of potassium tantalum niobate films formed by metalorganic deposition", *Journal of Applied Physics*, vol. 72, No. 2, pp. 615–619 (15 Jul. 1992).

*Primary Examiner*—Janyce Bell
*Attorney, Agent, or Firm*—Colin M. Raufer; Leonard A. Alkov; Glenn H. Lenzen, Jr.

[57] ABSTRACT

Oxide materials having a composition described by the formula $SrBi_{2.00}Ta_{2.00-x}Nb_xO_9$, where x ranges from 0.00 to 2.00 and is controlled to within about 1%, are provided having improved high temperature performance. A batch of the desired composition is initially prepared by conventional processes to provide a nominal composition that may be close to the desired composition, but not the exact desired composition. A portion of the batch is processed to form a thin film, the stoichiometry of which is then analyzed. The batch composition is then modified by adding thereto a quantity of one or more of the constituents to bring the batch composition to the desired stoichiometry. Further improved high temperature performance is achieved with values of x within the range of about 0.10 to 1.9, and more preferably, about 0.4 to 0.7, and most preferably about 0.56. The thus-modified metal organic acid salt solutions provide ceramic thin films having improved electrical properties (particularly consistent properties from batch-to-batch, improved ferroelectric remnant polarization, and much improved high temperature performance) as compared to the thin films prepared from unmodified solutions. The present invention provides for new materials, particularly new niobium-substituted, bismuth-layered structured materials and a process to make these materials on a consistent batch-to-batch basis.

19 Claims, 1 Drawing Sheet

5,885,648

PROCESS FOR MAKING STOICHIOMETRIC MIXED METAL OXIDE FILMS

This is a continuation application Ser. No. 08/635,313, filed Apr. 19, 1996 now abandoned.

This invention was made with United States Government support under Contract No. N00030-94-C-0001 awarded by the Department of the Navy. The U.S. Government has certain rights in this invention.

BACKGROUND OF THE INVENTION

1. Field of the Invention

The present invention relates to improved layered bismuth oxide ferroelectric materials and a process for fabrication of the materials into devices via the metal-organic decomposition method.

2. Description of Related Art

A new class of layered ferroelectric materials having a layered perovskite structure have begun finding use as thin ferroelectric films in radiation-hard, non-volatile microelectronic memories, high dielectric constant capacitors, energy storage devices, and the like. These layered materials comprise complex oxides of metals such as strontium, calcium, barium, bismuth, cadmium, lead, titanium, tantalum, hafnium, tungsten, niobium, zirconium, scandium, yttrium, lanthanum, antimony, chromium, and thallium that spontaneously form layered crystalline lattices that include alternating layers of distinctly different sublattices, such as ferroelectric and non-ferroelectric sublattices. Generally, each layered material will include two or more of the above metals. For example, strontium, bismuth, and tantalum form the layered material strontium bismuth tantalate, $SrBi_2Ta_2O_9$ (SBTO).

In addition to having good values of the ferroelectric parameters, it is also important that the physical quality of the ferroelectric films be suitable for use in manufacturing processes. For example, the film should have a relatively uniform grain size, which results in better thin film quality, i.e., films free of cracks and other defects. The film grain size should also be small compared to the thickness of the film; otherwise, the roughness of the film can be comparable to the thickness and other dimensions of the device components, which makes it difficult or impossible to fabricate devices within tolerances, with concomitant short circuits and other electrical breakdowns. Further, it is important that the fabrication processes be ones that can be performed relatively rapidly, since long processes are more expensive in terms of the use of facilities and personnel.

A variety of techniques has been disclosed for fabricating such layered ferroelectric materials; see, e.g., U.S. Pat. Nos. 5,434,102 and 5,439,845, both issued to H. Watanabe et al. The wafer is baked to dry the precursor and annealed to form a layered material on the wafer. Each metal in the ferroelectric material is formed separately as a carboxylate and the carboxylates are combined prior to application to the wafer. The carboxylates may be formed (in the case of strontium) by reacting the metal with a carboxylic acid. For the case of the other metals, these may be formed by reaction of a carboxylic acid with a metal alkyl or aryl or, more preferably, with a metal alkoxide.

The technique of Watanabe et al employs metallo-organic decomposition (MOD) to form the layered ferroelectric materials. These materials have the formula (rewritten) $SrBi_{4-2x+\alpha}\{(Ta_{1-y}Nb_y)_x(Ti_zZr_{1-z})_{2-2x}\}_2O_{15-x\ 6x}$, where $0 \leq x \leq 1.0$, $0 \leq y \leq 1.0$, $0 \leq z \leq 1.0$, and $x-2 \leq \alpha \leq 1.6(2-x)$.

In another technique, described in U.S. Pat. No. 5,316,579, issued to L. D. McMillan et al, fine mists of liquids are generated, using a rotating turbine blade disposed within an enclosure. A mixture of a liquid and a carrier gas are flowed into the enclosure such that it immediately impacts on the rotating turbine blade disposed near a lower end of the enclosure, and the resulting mist is withdrawn under vacuum near an upper end of the enclosure. The fine mists are used in the chemical vapor deposition of thin films of complex chemical compounds, such as ferroelectrics.

Applications of the layered ferroelectric materials include non-volatile memories (see, e.g., U.S. Pat. No. 5,406,510, issued to T. Mihara et al) and ferroelectric capacitors (see, e.g., C. A. Paz de Arujo et al, "Fatigue-free ferroelectric capacitors with platinum electrodes", *Nature,* Vol. 374, pp. 627–629 (13 Apr. 1995)).

Previous work in the art of ferroelectric materials has concentrated on the bismuth layered structure $SrBi_2Ta_2O_9$ (SBTO). It has been shown that this material can produce devices with much improved retention of polarization and fatigue (useful number of cycles of polarization) as compared to other ferroelectric metal oxides (for example, lead zirconium titanate [PZT]). Symetrix Corporation and its licensee, Kujundo Chemical of Japan, offer for sale a liquid source and process to construct BSTO material and devices. However, the inventors of the present invention have found that the supplied chemicals and process do not give devices with consistent electrical properties nor devices with sufficient properties at elevated temperatures.

In the patents and publications listed above, Symetrix Corporation describes liquid source materials and a process to produce bismuth-layered ceramic thin film ferroelectric devices. Both Symetrix, and their licensee (Kojundo Chemical) offer for sale the liquid source to the material, named "Y1", which is disclosed as the bismuth-layered structure $SrBi_2Ta_2O_9$. According to the Symetrix disclosures, a liquid source containing a metal salt—organic acid mixture having the stoichiometry of $Bi_{2.18}Sr_{0.99}Ta_{2.00}$ gives on processing the desired Y1 material. However, in the experience of the present inventors, the liquid source of Y1 supplied by either Symetrix or Kojundo does not on processing always give Y1 ferroelectric films of consistent electrical quality. Also, the Y1 thus formed, even in its best examples, does not have sufficient high temperature performance to meet the critical needs of the military and space systems hardware electronics applications.

Thus, a need remains to provide a liquid source that upon processing gives mixed metal oxide films of reproducible stoichiometry, and particularly ferroelectric films of consistent electrical quality and high temperature performance.

SUMMARY OF THE INVENTION

In accordance with the present invention, a process is provided for reproducibly making a stoichiometric mixed metal oxide structure having a stoichiometric composition. The process comprises:

(a) preparing a batch of a liquid precursor of the mixed metal oxide structure having a nominal composition;

(b) forming a first thin film from a portion of the batch;

(c) analyzing the first thin film to determine its composition;

(d) modifying the batch by adding thereto a quantity of one or more consituents thereof to form a modified batch having a composition that yields a second thin film having the stoichiometric composition.

In particular, layered oxide materials having a composition described by the formula $SrBi_{2.00}Ta_{2.00-x}Nb_xO_9$, where x ranges from 0.00 to 2.00 and is controlled to within about 1%, are provided having improved high temperature performance. A batch of the desired composition is initially prepared by conventional processes to provide a nominal composition that may be close to the desired composition, but not the exact desired composition. A portion of the batch is processed to form a thin film, the stoichiometry of which is then analyzed. The batch composition is then modified by adding thereto a quantity of one or more of the constituents to bring the batch composition to the desired stoichiometry.

The thus-modified metal organic acid salt solutions provide ceramic thin films having improved electrical properties (particularly consistent properties from batch-to-batch, improved ferroelectric remnant polarization, and much improved high temperature performance) as compared to the prior art thin films prepared from unmodified prior art solutions. The present invention provides for new materials, particularly new niobium-substituted, bismuth-layered structured materials and a process to consistently make these materials on a batch-to-batch basis.

There are four important aspects to the present invention:
1. The present invention is based on the inventors' belief that what matters to good electrical performance is the final composition on the wafer and that while those skilled in this art were conducting tests only on the solution used to make the final composition, that final composition is altered during processing contrary to the assumptions of those skilled in this art. Thus, testing the solution for composition does not guarantee what the final composition on the wafer will be.
2. In processing the portion of the batch to form a thin film on a wafer, the conventional processing techniques are employed as in making a ferroelectric device, except that both of the electrodes are omitted. The conventional processing employs platinum as one of the device electrodes, and platinum has been found by the present inventors to interfere with the analysis of the thin films. Specifically, X-ray fluorescence spectrosopy (XRF) is used to measure the concentrations of the metals, and the presence of platinum interferes with the XRF lines. The wafer without the platinum electrode, called herein the "XRF wafer", is otherwise identical with the device wafer. The elemental counts for the selected XF lines for the metals comprising the layered oxide composition can be related to a given desired composition. Thus, the second aspect of the present invention is the process of making the XRF wafer.
3. The third aspect of the present invention is the use of a feedback process, comprising making the XRF wafer, making an XRF measurement of the metals comprising the layered oxide composition, correcting the metal organic acid salt solution, making another XRF wafer, and making an XF measurement of that wafer. The feedback process permits optimization of the metal organic acid salt solution before expending a significant amount of energy to fabricate wafers for electrical characterization.
4. The fourth aspect of the present invention is the nature of the solution correction process itself Making the proper correction(s) minimizes the number of times the feedback process must be employed.

These aspects of the present invention may be used in the fabrication of other layered oxide materials, including the SrBi(Ta,Nb)(Ti,Zr) oxide referred to earlier. Further, the measurement of composition may be made by techniques other than XRF.

DESCRIPTION OF THE PREFERRED EMBODIMENTS

Figure 1:
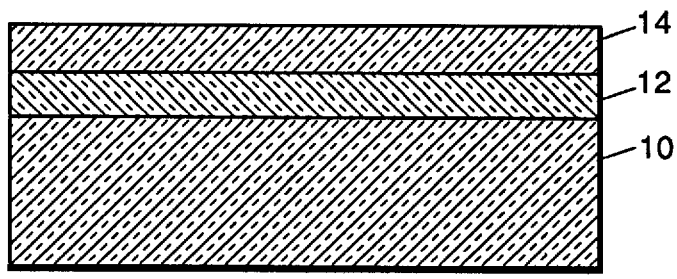
FIG. 1 is a cross-sectional view, depicting the thin ferroelectric film, formed on a buffer layer supported on a substrate.

New elemental compositions of the solid solution of the layered bismuth structure $SrBi_{2.00}Ta_{2.00-x}Nb_xO_9$ for x=0.00 to 2.00, wherein the stoichiometry of the constituent components is precisely defined to within about 1% are provided which have improved electrical properties and high temperature performance as compared to the prior art. A process is also provided for consistently making ferroelectric films of these compositions from batch-to-batch using different starting material with different purities, etc.

Controlled Modification of Y1 ($SrBi_2Ta_2O_9$) Materials

In the first example of the present invention, several batches of the Y1 liquid source were synthesized according to the Symetrix disclosures listed below. In brief, the preferred process is to react tantalum alkoxide and strontium metal with excess 2-ethylhexanoic acid in xylene to form the corresponding carboxylates, followed by addition of commercially available bismuth 2-ethylhexanoate. Control of stoichiometry was obtained via controlled addition of the starting materials with careful weighing. This then makes stoichiometry control variable according the purity of the starting materials and other variabilities in the process (see, e.g., U.S. Pat. Nos. 5,439,845 and 5,434,102, both issued to Watanabe et al; U.S. Pat. No. 5,316,579, issued to McMillan et al; U.S. Pat. No. 5,406,510, issued to Mihara et al; and C. A. Paz de Araujo et al, "Fatigue-free ferroelectric capacitors with platinum electrodes", Nature, Vol. 374, 13 Apr. 1995, all discussed above). In only one case did the resulting electrical properties of the processed film give electrical properties meeting the standards set by Symetrix. Stoichiometry analysis of the solution showed it to have the desired $Sr_{0.99}Bi_{2.18}Ta_{2.00}$ stoichiometry. The elemental analysis of the solution was completed via ICP-OES (Inductively Coupled Plasma—Optical Emission Spectrometry) with reference to external standards. This analysis method is slow, requires extensive sample preparation and manipulations, and is prone to errors due to the use of external standards. More importantly, others have shown for other metal organic ceramic systems and compositions of this type that it is not the stoichiometry of the solution, but the final stoichiometry of the fired film which is most important for consistent electrical properties; see, e.g., J. V. Mantese et al, "Characterization of potassium tantalum niobate films formed by metal-organic deposition", Journal of Applied Physics, Vol. 72(2), pp. 615–619 (15 Jul. 1992).

The mixture of carboxylates prepared above was in liquid form. A film of layered ferroelectric material was then prepared by spinning the liquid carboxylate mixture on a wafer, baking the coated wafer to dry the coating, and annealing the coated wafer to form the film.

X-ray fluorescence (XRF) spectroscopy was used to analyze the elemental composition of the fired films without sample preparation or manipulation. The results of fired films from two batches of liquid source materials are shown, with the corresponding relevant electrical properties shown in Table I, where $2P_r$ is the total switchable polarization in $\mu C/cm^2$ (the greater the value, the better the device is for memory applications) and $2E_c$ is the coercive field in $kV/cm^2$ (the lower the value, the easier the device is to switch). Film A from solution A was the film giving adequate electrical characteristics. Film B was from solution B, having ostensibly the same composition as solution A, but from a different batch.

TABLE I

Normalized XRF Elemental Concentrations and Electrical Properties of Acceptable (A), Not Acceptable (B) and Corrected (C) Ferroelectric Films

| Sample | Relative XRF Elemental Compositions | | | Electrical | |
|---|---|---|---|---|---|
| | Bismuth | Tantalum | Strontium | $2P_r$ ($\mu C/cm^2$) | $2E_c$ ($kV/cm^2$) |
| A(10475-9) | 49.5 | 22.0 | 28.5 | 17.8 | 104 |
| B(10296-152) | 48.2 | 22.2 | 29.6 | 12.5 | 95 |
| C(10296-152C) | 50.1 | 22.0 | 27.9 | 16.8 | 139 |

Using the XRF-derived elemental composition as a guide, remaining solutions from which the poor performing ferroelectric film, B, were derived were "corrected" by addition of the elemental 2-ethylhexanoates deemed deficient from the XRF data. That is, bismuth and tantalum 2-ethylhexanoates were added to solution B to give an improved film, C, with adequate electrical properties and stoichiometry much closer to film A. This result is the last line in Table I, above.

As is clearly shown by the data, correcting the elemental composition of the solutions to give properly composed fired films rectified the electrical properties of the corresponding devices.

Improved High Temperature Performance with Stoichiometric Control

The material Y1 ($SrBi_2Ta_2O_9$) has been found by the present inventors to develop internal fields that degrade the performance of the ferroelectric capacitors in memory applications. The internal field develops at high temperatures and in general supports the state of polarization imposed during the high temperature soak. However, the internal field degrades the amount of charge available in the opposite state of polarization. The degradation in the opposite state has been called "imprint", since if propagated far enough, will cause a memory failure; that is, the state written to during the high temperature soak has become imprinted, and while both states can be written to, a read of the memory produces only the imprinted state.

Table II shows electrical properties of commercial Y1 at room and at elevated temperatures. Comparison is provided with Y1 enhanced with 1.7 wt % Nb and 2.4 wt % Bi, prepared under the direction of the present inventors.

TABLE II

Improved High Temperature Electrical Properties of Y1 And Nb- and Bi-Enhanced Y1

| | Electrical Properties: $2P_r$ ($\mu C/cm^2$) and $E_c$ ($kV/cm^2$) | | | |
|---|---|---|---|---|
| | 25° C. | | 125° C. | |
| Sample | $2P_r$ | $2E_c$ | $2P_r$ | $2E_c$ |
| Y1 | 17.7 | 104 | 12.4 | 54 |
| Y1 + Nb and Bi | 18.9 | 179 | 15.1 | 105 |

The results suggest that the properties of Y1 can be considerably improved.

Based on the foregoing preliminary studies, the present inventors surmised that solid solutions of the two bismuth-layered ferroelectric materials, $SrBi_2Ta_2O_9$ and $SrBi_2Nb_2O_9$, might give improved polarization at the high temperatures required for the previously discussed elevated temperature applications. The present inventors thus formulated and processed several solid solutions of the two aforementioned materials by controlled addition of Bi, Sr, and Nb to the Y1 source solution described above (Sample A in Table I). Table III lists the compositions prepared and the corresponding electrical data.

TABLE III

Electrical Properties of Solid Solutions of $Bi_2Ta_2SrO_9$ and $Bi_2Nb_2SrO_9$

| | Electrical Data: $2P_r$ ($\mu C/cm^2$) and $E_c$ ($kV/cm^2$) | | | |
|---|---|---|---|---|
| | 25° C. | | 125° C. | |
| Sample Composition | $2P_r$ | $2E_c$ | $2P_r$ | $2E_c$ |
| $SrBi_{2.00}Ta_{2.00}O_9$ (x = 0.00) | 17.7 | 104 | 12.4 | 54 |
| $SrBi_{2.00}Ta_{1.82}Nb_{0.18}O_9$ (x = 0.18) | 21.1 | 147 | 14.5 | 63 |
| $SrBi_{2.00}Ta_{1.64}Nb_{0.36}O_9$ (x = 0.36) | 23.7 | 135 | 17.5 | 71 |
| $SrBi_{2.00}Ta_{1.44}Nb_{0.56}O_9$ (x = 0.56) | 26.2 | 144 | 19.6 | 79 |
| $SrBi_{2.00}Ta_{1.00}Nb_{1.00}O_9$ (x = 1.00) | 26.5 | 223 | NA | NA |
| $SrBi_{2.00}Nb_{2.00}O_9$ (x = 2.00) | 32.2 | 310 | NA | NA |

These data make it clear that solid solutions of $SrBi_2Ta_2O_9$ and $SrBi_2Nb_2O_9$ give ferroelectric capacitors which much improved electrical properties at room elevated temperature as compared to Y1 or enhanced Y1 materials. Based on these results, in the formula $SrBi_{2.00}Ta_{2.00-x}Nb_xO_9$ the value of x preferably ranges from about 0.10 to 1.90. Additionally, the present inventors have determined that x=0.56 is the most preferred embodiment in the foregoing formula. In the course of preparing many of these solutions, a number of different ferroelectric films were formed and tested to optimize the electrical properties of the 56%-substituted materials. Table IV below shows the normalized XRF concentration of the elements and the electrical properties for several of these.

TABLE IV

Normalized XRF Concentration of Elements
and Electrical Properties Thereof; x = 0.56

| LOT | Bi | Sr | Ta | Nb | 25° C. 2P$_r$ | 2E$_c$ | 125° C. 2P$_r$ | 2E$_c$ |
|---|---|---|---|---|---|---|---|---|
| 47 | 44.05(0.4) | 24.02(0.2) | 14.71(0.04) | 17.21(0.2) | 26.2 | 144 | 19.6 | 79 |
| 66 | 44.20(0.2) | 23.86(0.3) | 14.86(0.2) | 17.09(0.2) | 25.2 | 151 | 21.9 | 85 |
| 8 | 45.50(0.4) | 24.35(0.2) | 15.07(0.2) | 15.09(0.2) | 27.4 | 126 | 23.5 | 64 |
| 89 | 45.85(0.5) | 24.25(0.4) | 15.05(0.3) | 14.85(0.3) | 27.1 | 128 | 23.6 | 62 |
| 124a | 45.34(0.2) | 24.09(0.3) | 14.99(0.2) | 15.57(0.2) | 27.5 | 114 | | |
| 134 | 45.82(0.3) | 24.14(0.2) | 14.38(0.2) | 15.69(0.1) | 24.9 | 118 | | |
| 144 | 45.43(0.3) | 23.94(0.2) | 14.85(0.2) | 15.78(0.2) | 24.1 | 110 | | |

As can be seen from the data in Table IV, excellent electrical properties for all of the solutions are realized.

To demonstrate stoichiometric control of the solid solutions, a number of the 1.44/0.56 Ta/Nb (x=0.56) solid solutions were synthesized. XRF analysis of the annealed films derived from the solutions followed by elemental corrections based on analysis of that data has shown good control of the electrical properties of this four element problem (Bi, Sr, Ta, and Nb). Table IV is an example of such a correction.

TABLE V

Comparison of Initial Composition (E), Adjusted
Composition (F) to Reference Composition (D)

| Sample | Relative XRF Elemental Compositions | | | | Electrical | |
|---|---|---|---|---|---|---|
| | Bismuth | Tantalum | Niobium | Strontium | 2P$_r$ | 2E$_c$ |
| D (reference) | 45.5 | 15.07 | 15.09 | 24.35 | 27.4 | 126 |
| E(10475-100) | 43.85 | 14.75 | 17.34 | 24.01 | 23.5 | 147 |
| F(10475-100C) | 44.74 | 14.58 | 16.91 | 23.78 | 26.6 | 138 |

Sample F was prepared by addition of bismuth to the solution used to make sample E.

The high temperature anneal to which the films are subjected is within the range of about 500° to 1000° C., and preferably within the range of about 700° to 850° C.

It is contemplated that following analysis of the annealed film, determination of the amount of constituent(s) to add to the liquid source, and adding such amounts, then the process of the present invention is essentially complete. Fabrication of devices, using the corrected liquid source, or precursor, may then be undertaken. The process of the present invention reduces variation of device properties from batch-to-batch, with accurately-controlled composition.

However, it may be desirable to form a second film of the modified liquid source and determine its stoichiometry to ensure that it has the desired composition. If necessary, these steps may be further repeated, until one is confident that the stoichiometry of the liquid source is sufficiently controlled.

There are four important aspects to the present invention:

1. The present invention is based on the inventors' belief that what matters to good electrical performance is the final composition on the wafer and that while those skilled in this art were conducting tests only on the solution used to make the final composition, that final composition is altered during processing contrary to the assumptions of those skilled in this art. Thus, testing the solution for composition does not guarantee what the final composition on the wafer is.

2. In processing the portion of the batch to form a thin film on a wafer, the conventional processing techniques are employed as in making a ferroelectric device, except that both of the electrodes are omitted. The conventional processing employs platinum as the device electrodes, and platinum has been found by the present inventors to interfere with the analysis of the thin films. Specifically, X-ray fluorescence spectrosopy (XRF) is used to measure the concentrations of the metals, and the presence of platinum interferes with the XRF lines. The wafer without the platinum electrode, called herein the "XRF wafer", is otherwise identical with the device wafer. The elemental counts for the selected XRF lines for Sr, Bi, Ta, and Nb in SBTNO can be related to a given desired composition. Thus, the second aspect of the present invention is the process of making the XRF wafer.

3. The third aspect of the present invention is the use of a feedback process, comprising: making the XRF wafer; making an XF measurement of the four metals, here, Sr, Bi, Ta, and Nb; correcting the metal organic acid salt solution; making another XRF wafer; and making an XRF measurement of that wafer. The feedback process permits optimization of the metal organic acid salt solution before expending a significant amount of energy to fabricate wafers for electrical characterization.

4. The fourth aspect of the present invention is the nature of the solution correction process itself Making the proper correction(s) minimizes the number of times the feedback process must be employed.

The first three aspects above apply for any deposition technique of SBTNO or SBTO or any variant on these. For example, assuming that the deposition is performed by sputtering and that the sputtering machine was just repaired. The process of using electrical data to vary the composition of the new film could involve several wafers and a significant amount of work and the scrapping of a significant amount of product. However, the XRF examination of an XRF wafer would quickly provide feedback as to wafer composition prior to expending resources to fabrication of electrical test wafers or product. The same considerations apply to other deposition methods, such as metal organic chemical vapor deposition (MOCVD). The XRF technique disclosed herein can be used to adjust the component flows in an MOCVD machine without processing to completion and obtaining electrical data. The correction technique will be specific for each method, but the same fundamental principles apply. The calculated amount of correctant that is to be added applies independent of whether the deposition utilizes gas flow, deposition beam energy, or added solution.

Essentially, the elements that are deficient from the XRF data are added to "correct the solution". The amount of elements added is based on linear approximation of the to-be-corrected solution and the desired stoichiometric composition.

The XRF wafer referred to above is depicted in FIG. 1, and comprises a substrate 10, a buffer layer 12, and a mixed metal oxide layer 14. The substrate 10 conveniently comprises silicon, while the buffer layer 12 comprises silicon dioxide. The mixed metal oxide layer 14 comprises an SBTNO or SBTO composition, as disclosed herein, for example.

Figure 2:
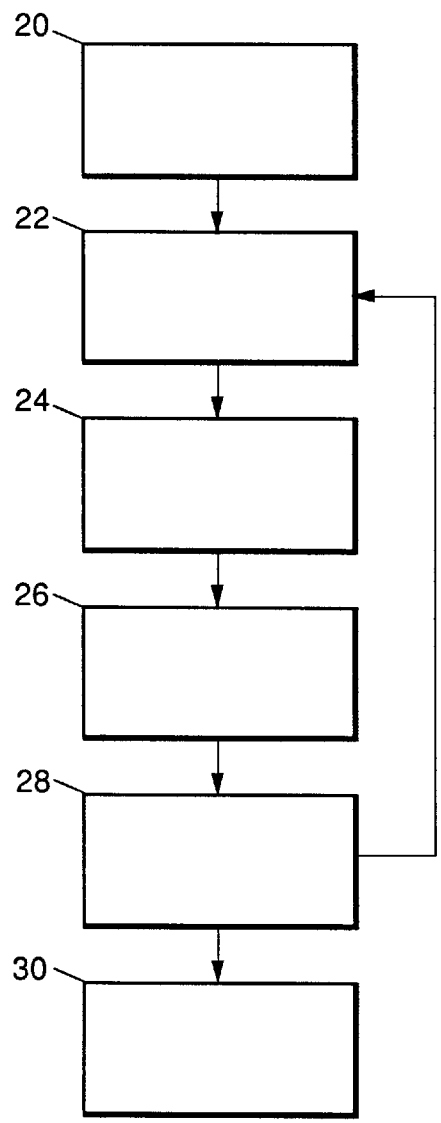
FIG. 2 is a process flow diagram, depicting the steps of fabricating a ferroelectric capacitor in accordance with the present invention.

FIG. 2 illustrates the process flow utilized in the practice of the present invention. In Step 20, the deposition apparatus/material is prepared to make an SBTNO thin film, such as from ethylhexanoates, as described above. In Step 22, conventional wafer fabrication is carried out, but without the bottom electrode, through an anneal of the mixed metal oxide layer 14. The process of Step 22 results in the XRF wafer depicted in FIG. 1. In Step 24, selected XRF lines of the metal elements in SBTNO (Sr, Bi, Ta, Nb) are measured. In Step 26, compositional analysis is performed. In Step 28, the deposition apparatus/material is corrected to achieve the desired or standard composition. If correction is indeed required, then Steps 22–28 are repeated as necessary. If no further correction is needed, then a device, such as a ferroelectric capacitor, is fabricated in Step 30 and the electrical properties are confirmed.

While the foregoing description of the preparation of the liquid source and annealed film is given in terms of carboxylate mixtures spun on a wafer and thermally processed, it will be readily appreciated by those skilled in this art that other methods of preparing the liquid source and depositing the liquid source on the wafer may also be employed in the practice of the present invention. Similarly, analysis of the film is not limited to XRF, and may be performed by any analytical technique that can be used to quickly and accurately determine the concentration of the constituent metal elements.

In addition, while the formation of strontium bismuth oxide films with one or both of tantalum and niobium having the formula

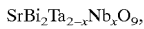

$SrBi_2Ta_{2-x}Nb_xO_9$, where x is in the range of 0 to 2, is disclosed, the process of the invention may also be used to form strontium bismuth oxide films of the formula

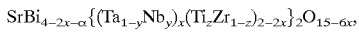

$SrBi_{4-2x-\alpha}\{(Ta_{1-y}Nb_y)_x(Ti_zZr_{1-z})_{2-2x}\}_2O_{15-6x}$, where $0 \leq x \leq 1.0$, $0 \leq y \leq 1.0$, $0 \leq z \leq 1.0$, and $x-2 \leq \alpha \leq 1.6(2-x)$.

Thus, there has been disclosed a process for reproducibly making mixed metal oxide layered structures, such as ferroelectric bismuth layered structures. It will be appreciated by those skilled in this art that various changes and modifications of an obvious nature may be made, and all such changes and modifications are considered to fall within the scope of the present invention, as defined by the appended claims.

What is claimed is:

1. A process for reproducibly making a stoichiometric mixed metal oxide structure having a stoichiometric composition, said process comprising:

(a) preparing a batch of liquid precursor of said mixed metal oxide structure having a first chosen composition;

(b) forming a first thin film on a first test wafer from a portion of said batch wherein said first thin film is exposed to the same processing conditions as those used to form said structure, including the step of annealing at 500°–1000° C. and wherein said first test wafer comprises a substrate without a bottom electrode;

(c) analyzing said first thin film after said exposure, using X-ray fluorescence analysis to provide results that indicate the composition of said first thin film;

(d) based on said results of said analyzing, modifying said batch by adding thereto a quantity of one or more constituents thereof to form a modified batch having a second composition;

(e) forming a second thin film on a second test wafer having the same structure as said first test wafer from said modified batch wherein said second thin film is exposed to the same processing conditions as those used to form said structure, including the step of annealing at 500°–1000° C. and wherein said second thin film after said exposure has said stoichiometric composition.

2. The process of claim 1 wherein said stoichiometric mixed metal oxide structure comprises a layered oxide structure comprising alternating layers of ferroelectric and non-ferroelectric sublattices, said layered oxide structure comprising at least two metals selected from the group consisting of strontium, calcium, barium, bismuth, cadmium, lead, titanium, tantalum, hafnium, tungsten, niobium, zirconium, scandium, yttrium, lanthanum, antimony, chromium, and thallium.

3. The process of claim 2 wherein said layered oxide structure comprises strontium and bismuth and at least one metal selected from the group consisting of tantalum and niobium.

4. The process of claim 2 further comprising, after Step (e), fabricating a ferroelectric device comprising said layered oxide structure, employing said modified batch.

5. The process of claim 1 wherein said X-ray fluorescence provides counts of each metal element, which are related to concentration of that element in said mixed metal oxide structure, which yields a first composition.

6. The process of claim 5 wherein said first composition is compared to a reference stoichiometric composition, and any deficiency of any element in said liquid precursor is corrected by adding an amount of that element to adjust said liquid precursor to more closely approximate said reference stoichiometric composition, thereby providing said stoichiometric composition.

7. The process of claim 6 wherein said stoichiometric composition is within about 1% of said reference stoichiometric composition.

8. The process of claim 1 wherein Steps (b) through (d) are repeated as necessary to provide said stoichiometric composition.

9. The process of claim 1 wherein said liquid precursor of said first chosen composition is prepared by forming each metal component separately as a carboxylate and then combining all carboxylates to form said liquid precursor.

10. The process of claim 9 wherein said carboxylates are formed by reaction of (1) carboxylic acid with metal alkoxides, or (2) carboxylic acid with metal alkyls or metal aryls, or (3) carboxylic acid with metals.

11. The process of claim 10 wherein said mixed metal oxide structure comprises strontium bismuth tantalate.

12. The process of claim 11 wherein said mixed metal oxide structure is formed by reacting tantalum alkoxide and strontium metal with excess 2-ethylhexanoic acid, followed by addition of bismuth 2-ethylhexanoate.

13. The process of claim 10 wherein said mixed metal oxide structure comprises strontium bismuth tantalate-niobate.

14. The process of claim 13 wherein said mixed metal oxide structure is formed by reacting tantalum alkoxide, niobium alkoxide, and strontium metal with excess 2-ethylhexanoic acid, followed by addition of bismuth 2-ethylhexanoate.

15. The process of claim 1 wherein said first and second thin films are prepared by spinning a layer of a portion of said liquid precursor on a wafer to form a coated wafer, baking said coated wafer to dry said liquid precursor, and annealing said coated wafer to form said layered oxide structure.

16. The process of claim 1 wherein said mixed metal oxide structure has a formula given by $$SrBi_2Ta_{2-x}Nb_xO_9,$$

where x has a value within the range of 0 to 2.

17. The process of claim 16 wherein the value of x is within the range of about 0.10 to 1.9.

18. The process of claim 17 wherein the value of x is about 0.4 to 0.7.

19. The process of claim 18 wherein the value of x is about 0.56.

* * * * *